(12) United States Patent
Li et al.

(10) Patent No.: US 6,281,072 B1
(45) Date of Patent: Aug. 28, 2001

(54) MULTIPLE STEP METHODS FOR FORMING CONFORMAL LAYERS

(75) Inventors: Weimin Li; Gurtej S. Sandhu, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/629,998

(22) Filed: Aug. 1, 2000

Related U.S. Application Data

(62) Division of application No. 09/076,253, filed on May 11, 1998.

(51) Int. Cl.$^7$ ................................................ H01L 21/8242
(52) U.S. Cl. ........................ 438/253; 438/256; 438/396; 438/399; 438/627
(58) Field of Search .................................. 438/627, 253, 438/256, 396, 399

(56) References Cited

U.S. PATENT DOCUMENTS

| | | |
|---|---|---|
| 4,847,111 | 7/1989 | Chow et al. . |
| 5,187,120 | 2/1993 | Wang . |
| 5,270,241 | 12/1993 | Dennison et al. . |
| 5,341,016 | 8/1994 | Prall et al. . |
| 5,392,189 | 2/1995 | Fazan et al. . |
| 5,487,923 | 1/1996 | Min et al. . |
| 5,529,953 | 6/1996 | Shoda . |
| 5,567,243 | 10/1996 | Foster et al. . |
| 5,633,200 | 5/1997 | Hu . |
| 5,654,233 | 8/1997 | Yu . |
| 5,691,235 | * 11/1997 | Meikle et al. ........................ 438/396 |
| 5,696,017 | * 12/1997 | Ueno ..................... 438/253 |
| 5,710,070 | 1/1998 | Chan . |
| 5,858,831 | * 1/1999 | Sung ..................... 438/396 |
| 5,913,145 | 6/1999 | Lu et al. . |
| 5,970,374 | 10/1999 | Teo . |

(List continued on next page.)

FOREIGN PATENT DOCUMENTS

| | | |
|---|---|---|
| 0 788 156 | 8/1997 | (EP) . |
| 0 840 363 | 5/1998 | (EP) . |
| 99/14792 | 3/1999 | (WO) . |

OTHER PUBLICATIONS

"Collimated Sputtering For High Aspect Ratio Trench/Via Fill With a Liner". *IBM Technical Disclosure Bulletin*, 35(5):456–459 (1992).

Primary Examiner—John F. Niebling
Assistant Examiner—Lynne A. Gurley
(74) Attorney, Agent, or Firm—Mueting, Raasch & Gebhardt, P.A.

(57) ABSTRACT

A two-step formation process provides conformal coverage at both the bottom surface and one or more side walls of an opening for various applications, e.g., high aspect ratio contact liners or storage cell capacitor electrode applications, and provides conformal coverage on any features requiring such coverage. A method for forming a conformal layer in the fabrication of integrated circuits includes providing a substrate assembly including at least a generally horizontal first surface and a second surface extending therefrom. A first portion of the layer is formed selectively on the horizontal first surface during a first period of time and a second portion of the layer is deposited selectively on the second surface during a second period of time. Further, one illustrative process for forming tungsten nitride in the fabrication of integrated circuits includes forming tungsten nitride on the horizontal first surface during a first period of time and depositing tungsten nitride on the second surface during a second period of time by plasma enhanced chemical vapor deposition. The tungsten nitride may be formed on the first surface by plasma enhanced chemical vapor deposition using a first reactant gas mixture including $WF_6$, at least one of $NF_3$ and $N_2$, and $H_2$ with the tungsten nitride being deposited on the second surface by plasma enhanced chemical vapor deposition using a second reactant gas mixture including $WF_6$, at least one of $NF_3$ and $N_2$, $H_2$, and He.

13 Claims, 6 Drawing Sheets

U.S. PATENT DOCUMENTS

| | | | |
|---|---|---|---|
| 5,981,330 | * 11/1999 | Jenq | 438/253 |
| 5,981,376 | 11/1999 | Komatsu et al. | |
| 5,994,211 | 11/1999 | Wang et al. | |
| 6,069,038 | * 5/2000 | Hashimoto et al. | 438/396 |
| 6,077,779 | 6/2000 | Sue et al. | |
| 6,087,257 | 7/2000 | Park et al. | |
| 6,106,677 | 11/1999 | Sandhu. | |
| 6,146,941 | * 11/2000 | Huang et al. | 438/253 |
| 6,187,631 | * 2/2001 | Harshfield | 438/253 |
| 6,188,097 | * 2/2001 | Derderian et al. | 257/306 |
| 6,197,650 | * 3/2001 | Wu | 438/386 |

* cited by examiner

MULTIPLE STEP METHODS FOR FORMING CONFORMAL LAYERS

This application is a division of Ser. No. 09/076,253 filed May 11, 1998.

FIELD OF THE INVENTION

The present invention relates to the formation of layers, e.g., tungsten nitride layers, in the fabrication of semiconductor devices. More particularly, the present invention pertains to the formation of such layers to achieve conformal coverage on features.

BACKGROUND OF THE INVENTION

In the fabrication of integrated circuits, various layers, e.g., conductive layers and insulative layers, are used. For example, during the formation of semiconductor devices, such as dynamic random access memories (DRAMs), static random access memories (SRAMs), microprocessors, etc., insulating layers are used to electrically separate conductive layers such as doped polycrystalline silicon, doped silicon, aluminum, refractory metal silicides, etc. It is often required that the conductive layers be interconnected through holes or openings in the insulating layer. Such holes are commonly referred to as contact holes, i.e., when the hole extends through an insulating layer to an active device area, or vias, i.e., when the hole extends through an insulating layer between two conductive layers.

The profile of an opening is of particular importance such that specific characteristics are achieved when a contact hole or via is provided or filled with a conductive material. For example, many holes are high aspect ratio holes or openings. In many cases, where openings are high aspect ratio openings, it is difficult to form certain materials within the openings. For example, in the formation of tungsten nitride on both the bottom and side walls defining an opening using conventional tungsten nitride formation techniques, poor step coverage results.

Tungsten nitride is a preferably used material for formation of barriers in the fabrication of semiconductor devices to prevent the diffusion of one material to an adjacent material. For example, when aluminum contacts silicon surfaces, spiking can occur, and when aluminum comes into direct contact with tungsten, a highly resistive alloy is formed. Further, for example, copper diffusion in silicon occurs when such materials are in direct contact. Diffusion barriers, e.g., tungsten nitride barriers, are commonly used to prevent such undesirable reactions. Tungsten nitride is preferably used in such diffusion barrier applications as it has low resistivity and is thus suitable for use in conductive interfaces for high speed applications. Further, tungsten nitride is also thermally stable, making it more suitable for high temperature processing which is common in integrated circuit fabrication techniques.

Conductive materials are also used in the formation of storage cell capacitors for use in semiconductor devices, e.g., DRAMs. Storage capacity and size are important characteristics of a storage cell. One way to retain the storage capacity of a device and decrease its size is to increase the dielectric constant of the dielectric layer of the storage cell capacitor. Therefore, high dielectric constant materials are used in such applications interposed between two electrodes. One or more layers of various conductive materials may be used as the electrode material. However, generally, one or more of the layers of conductive materials must have certain barrier properties and oxidation resistance properties, particularly due to the processes used in forming high dielectric constant materials. Tungsten nitride is a material that resists oxidation and provides very good barrier properties as described above. As such, tungsten nitride is advantageously used as an electrode material for a storage cell capacitor.

However, many storage cell capacitors are formed by processes including high aspect ratio openings. For example, in U.S. Pat. No. 5,392,189 to Fazan, et al., entitled "Capacitor Compatible with High Dielectric Constant Materials Having Two Independent Insulative Layers and the Method for Forming Same," issued Feb. 21, 1995, a storage cell capacitor is provided wherein electrodes are formed of a conductive material within high aspect ratio openings having a bottom surface and side walls. As previously described, conventional tungsten nitride formation processes generally have poor step coverage and, therefore, conventional methods for forming tungsten nitride in high aspect ratio openings for electrodes of storage cell capacitors is inadequate. For example, in conventional PECVD processing, tungsten nitride is deposited with thicknesses greater on bottom surfaces than on side wall surfaces defining high aspect ratio openings.

Various methods for forming tungsten nitride are known and described. However, such methods do not provide the conformal coverage adequate for various applications. Particularly, such conformal coverage is lacking, for example, in applications wherein tungsten nitride is formed relative to high aspect ratio openings, e.g., contact and via openings, certain storage cell capacitor structures, etc.

For example, one method of forming tungsten nitride is with chemical vapor deposition (CVD). Generally, for example, conventional chemical vapor deposition processes react $WF_6$, $N_2$, and $H_2$ at a high temperature forming $WN_x$ and HF. Problems attendant to this process include the detrimental tendency of the fluorine to attack exposed surfaces of the semiconductor wafers on which the tungsten nitride is being formed and problems generally associated with high temperatures.

Another method of forming tungsten nitride is by physical vapor deposition (PVD). Conventional PVD technology involves reactive sputtering from a tungsten target in an atmosphere of gaseous nitrogen with an argon carrier gas. Conventional PVD processes may result in a film deposited on the bottom surface defining a high aspect ratio opening. However, it is inadequate for formation of tungsten nitride on side walls of such openings.

Further, as described in U.S. Pat. No. 5,487,923 to Min et al., entitled "Method for Depositing Tungsten Nitride Thin Films for Formation of Metal Wirings of Silicon Semiconductor Elements," issued Jan. 30, 1996, a plasma enhanced chemical vapor deposition (PECVD) process for formation of tungsten nitride is described. As described therein, the deposition of the tungsten nitride thin film is carried out using a $WF_6$, $H_2$, and $NH_3$ reactant gas mixture. Various parameters for the PECVD process are described. However, such a PECVD process does not provide for adequate conformal and uniform coverage in small high aspect ratio openings. Also, it is known that adducts, such as $WN_xNH_y$, form during reactions containing $NH_3$. Such adducts are solid in form and cause particle problems.

Further, various other layers, e.g., insulating layers such as silicon dioxide or silicon nitride, are in many circumstances deposited on features having steps requiring conformal coverage, e.g., capacitor structures. Various conventional methods for depositing such layers do not provide for adequate conformal and uniform coverage for such features in such circumstances. For example, in conventional CVD methods for depositing silicon nitride over stepped features, more silicon nitride may be deposited on sidewalls than on lower surfaces from which such walls extend depending upon the parameters of the CVD process.

SUMMARY OF THE INVENTION

To overcome the problems described above, and others which will be apparent from the detailed description below, a two-step formation process to provide conformal coverage at both the bottom surface and one or more side walls of a opening for various applications, e.g., high aspect ratio contact liners or storage cell capacitor electrode applications, or to provide conformal coverage on any features requiring such coverage, e.g. top electrode of a capacitor, is described. The two-step process provides for conformal step coverage in such varied applications.

A method for forming a conformal layer in the fabrication of integrated circuits according to the present invention includes providing a substrate assembly including at least a generally horizontal first surface and a second surface extending therefrom. A first portion of the layer is formed selectively on the horizontal first surface during a first period of time and a second portion of the layer is deposited selectively on the second surface during a second period of time.

In various embodiments of the method, the layer may be an insulative layer or a conductive layer, an opening may be defined at least in part by the first and second surfaces wherein the opening is a small high aspect ratio opening having an aspect ratio greater than about 1 and a critical dimension of less than about 1 micron, the deposition of the second portion of the layer selectively on the second surface may include providing a reactant gas mixture and subjecting the reactant gas mixture to a glow discharge created by applying an electromagnetic field across the reactant gas mixture, and the formation of the first portion of the layer selectively on the first surface may be performed before or after the deposition of the second portion of the layer selectively on the second surface.

A method for forming tungsten nitride in the fabrication of integrated circuits according to the present invention includes providing a substrate assembly with a generally horizontal first surface and a second surface extending therefrom. Tungsten nitride is formed on the horizontal first surface during a first period of time and tungsten nitride is deposited on the second surface during a second period of time by plasma enhanced chemical vapor deposition.

In one embodiment of the method, tungsten nitride is formed on the first surface by plasma enhanced chemical vapor deposition using a first reactant gas mixture including $WF_6$, at least one of $NF_3$ and $N_2$, and $H_2$. The tungsten nitride is deposited on the second surface by plasma enhanced chemical vapor deposition using a second reactant gas mixture including $WF_6$, at least one of $NF_3$ and $N_2$, $H_2$, and He. Further, the partial pressure of $WF_6$ and the at least one $NF_3$ and $N_2$ used in depositing tungsten nitride on the second surface during the second period of time is in the range of about 1.5 times to about 20 times the partial pressure of $WF_6$ and the at least one $NF_3$ and $N_2$ used in depositing the tungsten nitride on the first surface during the first period of time.

In another embodiment of the method, tungsten nitride is deposited on the second surface during the second period of time by plasma enhanced chemical vapor deposition using a gas mixture including $WF_6$, at least one of $NF_3$ and $N_2$, $H_2$, and He. The partial pressure of $WF_6$ and the at least one of $NF_3$ and $N_2$ is in a range of about 0.1 percent to about 20 percent of the total pressure. Further, the deposition may be performed at a substrate temperature in a range of about 200° C. to about 500° C.

In another method according to the present invention, a conformal layer of tungsten nitride is formed in an opening defined by a bottom surface and at least one side wall extending therefrom. The method includes depositing tungsten nitride on at least the bottom surface by plasma enhanced chemical vapor deposition using a first gas mixture including $WF_6$, at least one of $NF_3$ and $N_2$, and $H_2$, The method further includes depositing tungsten nitride on at least the side wall by plasma enhanced chemical vapor deposition using a second reactant gas mixture including $WF_6$, at least one of $NF_3$ and $N_2$, $H_2$, and He.

In one embodiment of the method, the partial pressure of $WF_6$ and the at least one $NF_3$ and $N_2$ used in depositing tungsten nitride on the at least one side wall is in a range of about 0.1 percent to about 20 percent of the total pressure and the partial pressure of He is in a range of about 0.5 percent to about 50 percent of the total pressure when depositing tungsten nitride on the at least one side wall.

In other methods according to the present invention, the two step method of forming a conformal layer is used in a variety of applications, for example, in small high aspect ratio openings, in the formation of an electrode for a capacitor, in formation of an interconnect structure, etc.

BRIEF DESCRIPTION OF THE DRAWINGS

The present invention will be better understood from reading the following description of illustrative embodiments with reference to the attached drawings, wherein below.

DETAILED DESCRIPTION OF THE EMBODIMENTS

The present invention shall be described generally with reference to FIGS. 1A–1D. Thereafter, embodiments and illustrations of applications using the present invention shall be described with reference to FIGS. 2A–2D and FIGS. 3A–3D. It will be apparent to one skilled in the art that scaling in the figures does not represent precise dimensions of the various elements illustrated therein.

Figure 1A:
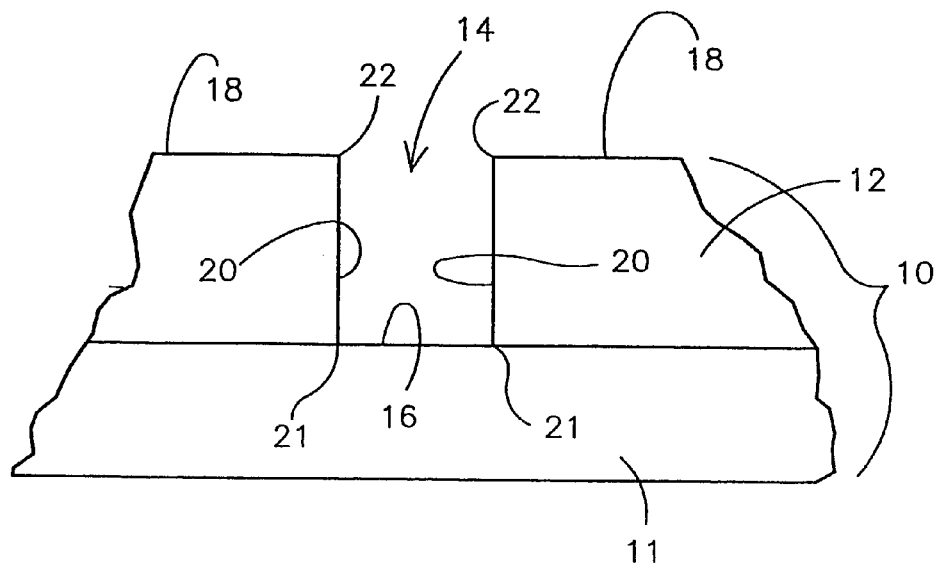
FIGS. 1A–1D generally illustrate a two-step formation process, e.g., a two-step tungsten nitride process, according to the present invention.

FIGS. 1A–1D illustrate the two-step method of forming a conformal layer of material 40 (FIG. 1D), e.g., tungsten nitride, on a substrate assembly 10 according to the present invention. As shown in FIG. 1A, substrate assembly 10 includes a first portion 11 and a second portion 12. Second portion 12 is formed on first portion 11 and includes an opening 14 defined therein by a bottom surface 16 of first portion 11 and one or more side walls of second portion 12. Bottom surface 16 is a generally horizontal surface from which the one or more side walls 20 extend. The side walls 20 may be substantially orthogonal to the horizontal bottom surface 16 as shown in FIG. 1A or may be at any other desired angle for forming a desired opening 14 in second portion 12. Second portion 12 further includes a horizontal upper surface 18 generally parallel to bottom surface 16. The one or more side walls 20 and the generally horizontal upper surface 18 of second portion 12 share an edge or corner 22. Likewise, the one or more side walls 20 also form a corner or edge 21 with the bottom surface 16.

As used in this application, "substrate assembly" refers to either a semiconductor substrate such as the base semiconductor layer, e.g., the lowest layer of silicon material in a wafer, or a silicon layer deposited on another material such as silicon on sapphire, or a semiconductor substrate having one or more layers or structures formed thereon or regions formed therein. When reference is made to a substrate assembly in the following description, various process steps may have been previously used to form or define regions, junctions, various structures or features, and openings such as vias, contact openings, high aspect ratio openings, etc.

For example, second portion 11 of substrate assembly 10 may be a structure upon which a capacitor is formed with the second portion 12 of the substrate assembly 10 being an insulative layer such as an oxide layer, e.g., silicon dioxide, BPSG, PSG, etc. As such, opening 14 defined in substrate assembly 10 by bottom surface 16 and the one or more side walls 20 includes surfaces upon which a bottom electrode of a storage cell capacitor is formed such as described with reference to FIGS. 2A–2D.

Further, for example, the first portion 11 of substrate assembly 10 may include a source and/or drain region to which a contact is to be made through an insulative layer 12. As such, opening 14 defined by bottom surface 16 and the one or more side walls 20 is a contact opening to a region to be interconnected using a conductive material deposited according to the present invention, such as described with reference to FIGS. 3A–3D herein.

Further, for example, the substrate assembly 10 may include any structure upon which a conformal insulative layer is to be deposited. For example, the structure may include a stepped feature such as an isolation trench or any other feature upon which a conformal layer is desired.

The two-step method according to the present invention may be used for any application requiring conformal layer formation, e.g., conformal layers of conductive materials such as tungsten nitride or insulative layers such as silicon dioxide layers or other oxide layers. However, the present invention is particularly beneficial for providing conformal coverage of tungsten nitride on surfaces of features, e.g., step coverage at both the bottom surface and one or more side wall surfaces defining small high aspect ratio openings such as contact holes or vias through an oxide insulating layer to an underlying material, trenches, openings for formation of cell electrodes, etc. As such, one skilled in the art will recognize that the two-step formation method may be used to form any insulative or conductive layer, e.g., tungsten nitride, on any surface areas requiring uniform and conformal layers. As used herein, conformal coverage refers to providing a generally uniform layer of material on a surface in the same shape as the surface, i.e., the surface of the layer and the surface being covered are generally parallel. One skilled in the art will recognize, of course, that the term "generally" is used to allow for acceptable tolerances.

As described herein, small high aspect ratio openings have feature sizes or critical dimensions below about 1 micron (e.g., such as diameter or width of an opening being less than about 1 micron) and may have critical dimensions below about 0.5 microns and even below about 0.3 microns. Such small high aspect ratio openings have aspect ratios greater than about 1 and may further have aspects ratios greater than about 5 and even greater than 20. Such critical dimensions and aspect ratios are applicable to contact holes, vias, trenches, and any other configured openings. For example, a trench having an opening width of 1 micron and a depth of 3 microns has an aspect ratio of 3. Further, for example, where line spacing is 0.22 microns, the present invention provides desirable conformal step coverage within a high aspect ratio opening.

Although the present invention is more specifically described below with respect to the deposition of tungsten nitride, the present invention is applicable to the formation of any conformal layer using a multiple step process wherein a portion of a layer is selectively formed on a generally horizontal surface during one process step and further portions of the layer are selectively formed on other surfaces extending from the horizontal surface, e.g., side wall, during one or more other process steps. In other words, at least two process steps performed during different time periods are used to deposit a conformal layer over a substrate assembly surface. The conformal layer deposited may be insulative or may be conductive. For example, the multiple step process may be used to deposit a conformal oxide layer, e.g., a silicon dioxide layer using silane and nitrous oxide or a tetraethylorthosilicate (TEOS) oxide layer using oxygen and TEOS. Further, for example, a silicon nitride layer may be deposited using silane and ammonia. Further, conductive layers, such as titanium nitride, tungsten nitride or any other conductive layer that may be difficult to conformally deposit on features, e.g., high aspect ratio openings, may be deposited according to the multiple step process described herein.

It will be readily apparent to one skilled in the art that the multiple step process allows each process step to be tailored for achieving selective deposition on the portion of the substrate assembly surface desired. For example, deposition of a material selectively on a generally horizontal surface may require different process parameters than deposition of such material selectively on a surface extending therefrom, e.g., a generally vertical surface. Such different process parameters and method steps for performing such selective deposition is illustrated below with respect to tungsten nitride, but one skilled in the art will recognize that the controllable process steps for achieving selective deposition of materials on features, e.g., stepped features, is equally applicable to other materials. As used herein, forming a material selectively on a surface refers to selectively depositing the material to a much greater degree on one particular portion of a surface relative to other portions of the surface; however, a small amount of material may form on the other portions of the surfaces. For example, as shown in FIG. 1B, material is selectively formed on the horizontal surfaces of the substrate assembly with only little formation of the material on the sidewalls proximate the corners.

Figure 1B:
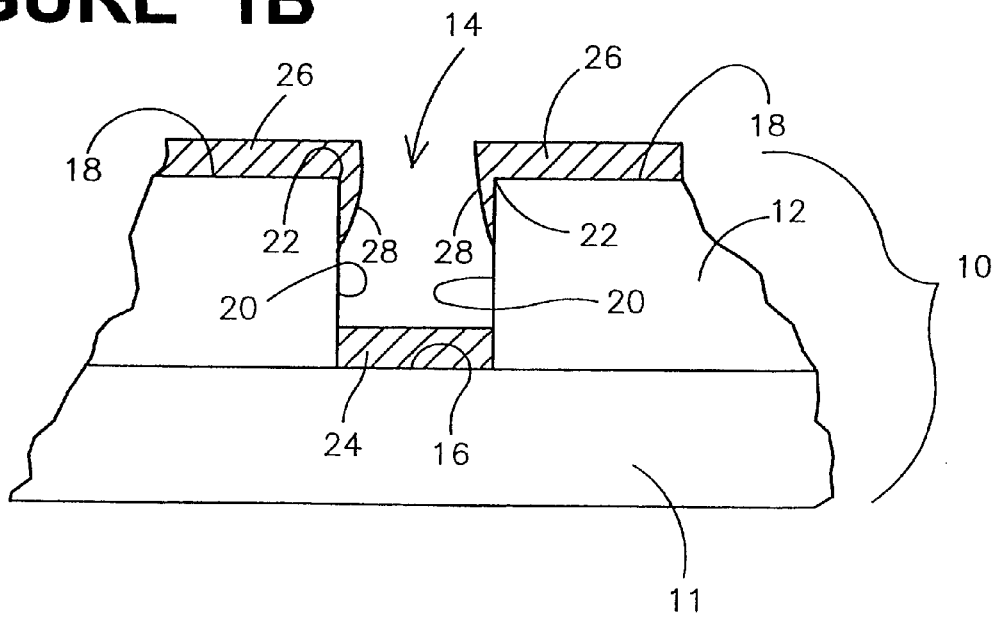
Figure 1C:
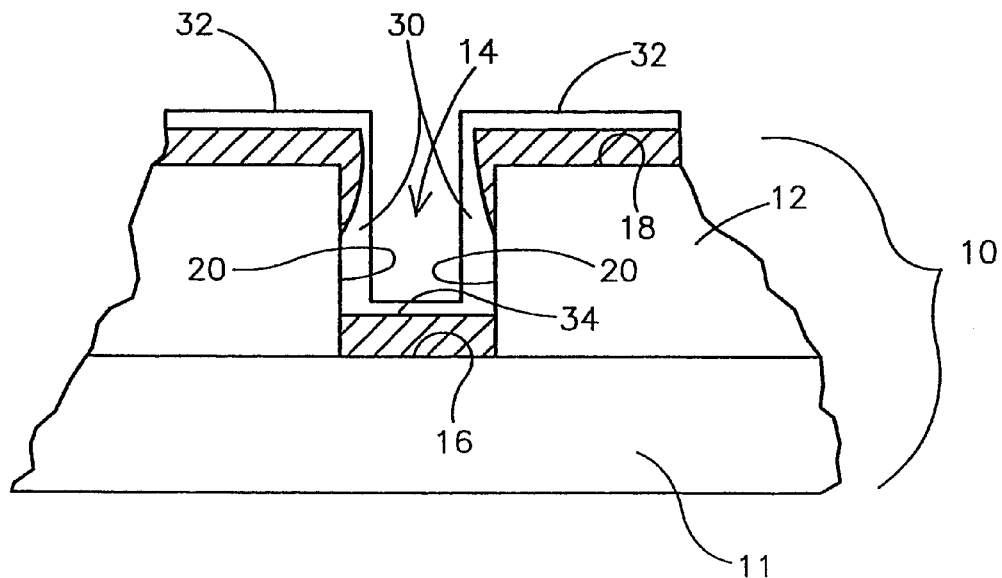
Figure 1D:
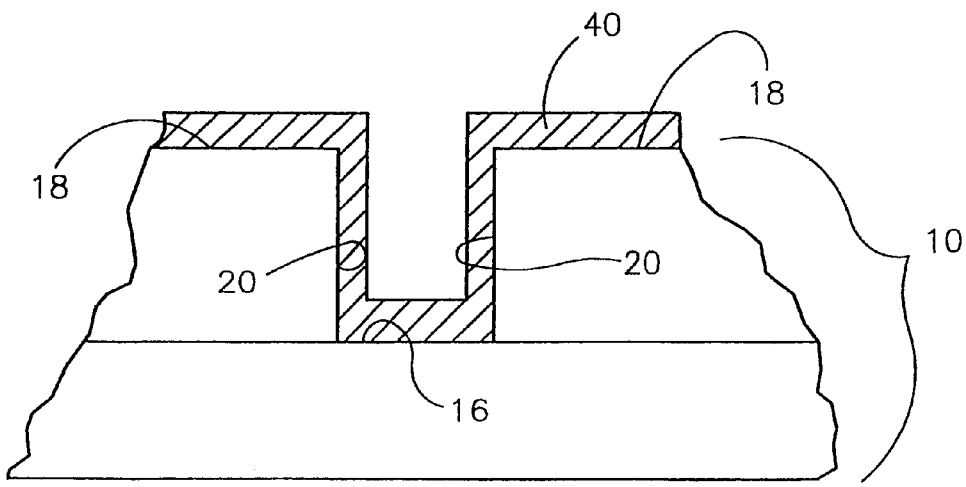

The formation of tungsten nitride according to the present invention shall be described using the illustration of FIGS. 1A–1D. The process includes a first step of forming tungsten nitride on at least the generally horizontal surfaces during a first time period, e.g., surface 16 at the bottom of opening 14 and surfaces 18 at the upper portion of substrate assembly 10 as shown in FIG. 1B. A second step of the tungsten nitride formation method includes forming tungsten nitride selectively on at least the side walls 20 defining the opening 14 as shown in FIG. 1C. The resulting structure of a conformal uniform tungsten nitride layer 40 over substrate assembly 10 is shown in FIG. 1D.

One skilled in the art will recognize that the steps of the sequential multiple step process may be performed in any order. For example, the formation of tungsten nitride on the one or more side walls 20 may be performed prior to the formation of tungsten nitride on the generally horizontal surfaces including bottom surface 16. However, preferably, the tungsten nitride is formed first on bottom surface 16 and the other generally horizontal surfaces, and thereafter, the tungsten nitride is formed on the one or more side walls 20.

In the first step of the illustrative tungsten nitride formation method, as shown in FIG. 1B, tungsten nitride is formed over at least the horizontal surface areas of the substrate assembly 10. For example, tungsten nitride region 24 is formed on bottom surface 16 defining opening 14 and tungsten nitride regions 26 are formed on upper horizontal surfaces 18. Further, tungsten nitride may form adjacent corner or edge 22 on the one or more side walls 20. However, tungsten nitride is not formed conformally on the one or more side walls 20.

The tungsten nitride formed on the generally horizontal surfaces, e.g., bottom surface 16 and upper surfaces 18, may be formed by one or more various processes. For example, the formation of such tungsten nitride material 24, 26, and 28 on the generally horizontal surfaces may be formed by sputtering from a tungsten nitride deposition target or from a tungsten deposition target in a nitrogen atmosphere. For example, at least one illustration of such physical vapor deposition of tungsten nitride is described in U.S. Pat. No. 5,633,200 to Hu, entitled "Process for Manufacturing a Large Grain Tungsten Nitride Film and Process for Manufacturing a Lightly Nitrided Titanium Salicide Diffusion Barrier with a Large Grain Tungsten Nitride Cover Layer," issued May 27, 1997. Further, such tungsten nitride regions 24, 26, 28 may be deposited by chemical vapor deposition, e.g., atmospheric, low pressure, or plasma enhanced chemical vapor deposition (PECVD). Preferably, the formation of tungsten nitride on the generally horizontal surfaces, e.g., bottom surface 16 and upper surfaces 18, is performed by PECVD.

The steps according to the present invention using plasma enhanced chemical vapor deposition are carried out in a plasma enhanced chemical vapor deposition reactor, such as a reaction chamber available from Genus, Inc., Applied Materials, Inc., or Novelus, Inc. However, any reaction chamber suitable for performing PECVD may be used.

In PECVD processes, the reactant gases are introduced into the reaction chamber which is at low pressure (i.e., low compared to ambient pressure). The reaction chamber is evacuated by means of vacuum pumps to remove undesirable reactive species, such as oxygen. Then, a reactant gas mixture including the reactant gases are admitted into the chamber. This is accomplished by one of various techniques. For example, the introduction into the chamber may be accomplished with the use of compounds which are gases at room temperature or by heating a volatile compound and bubbling a gas through it to carry it into the reaction chamber. It should be readily apparent that the techniques used for introduction of the compounds into the chamber may be varied and that the present invention is not limited to any particular technique. Typically, the reactant gases are admitted at separate inlet ports. In addition to the reactive compound, a dilution gas may be flowed into the chamber. For example, argon may be flowed through the chamber at a varied flow rate. In PECVD, a plasma is created by applying an electric field across the reactant gas mixture containing the reactant gases. As used herein, PECVD includes the use of any created plasma including high density plasmas. A high density plasma is a plasma having a density of about $10^{11}$ ions/cm$^3$ to about $10^{13}$ ions/cm$^3$. The plasma adds energy to the reaction to drive the reaction to completion. Generally, use of a plasma process allows the substrate assembly to be kept at a somewhat lower temperature than other CVD processes. Any suitable power source may be used to generate the plasma in the reaction chamber. Suitable power sources include an RF generator, a microwave (e.g., 2.5 GHz microwave source) generator, or an electron cyclotron resonance (ECR) source. A preferred power source is an RF generator operating as a standard 13.56 MHz source.

For example, in the deposition of tungsten nitride the reactant gases would include a tungsten containing gas and a nitrogen containing gas. An RF generator would supply power between a substrate holder in the chamber holding a wafer and the reaction chamber, thus creating a plasma in the region above the wafer upon which the tungsten nitride is to be deposited. The reactant gases begin to react inside the reaction chamber as they are absorbed at the heated surface of the wafer. The wafer is heated, for example, by a resistively heated susceptor, by convection from a substrate holder (such as graphite or alumina) that is heated to a preferred temperature via a lamp source, or any other heating method. A chemical reaction occurs, thereby depositing a layer of tungsten nitride on the surface of the wafer.

Preferably, in accordance with the present invention, to form tungsten nitride on the generally horizontal surfaces, e.g., bottom surface 16, WF$_6$ and at least one of NF$_3$ and N$_2$ are introduced into the reaction chamber, such as via flow meters. Further, H$_2$ as a reducing gas is introduced into the reaction chamber. Yet further, an inert gas, such as argon or helium, may be supplied to the reaction chamber as a dilution gas to change the total gas flows thereto and the partial pressures within the reaction chamber. Any inert gas that is nonreactive with the reactant gases may be used. In the reaction chamber, the reactant gas mixture is preferably subjected to a glow discharge or plasma created by applying a radio frequency electromagnetic field of 13.56 megahertz at a power density of about 0.1 W/cm$^2$ to about 2 W/cm$^2$ across the reactant gas mixture.

Preferably, the reactant gas mixture is such that the partial pressure of the tungsten and nitrogen containing reactant gases (i.e., WF$_6$ and at least one of NF$_3$ and N$_2$) have a partial pressure of about 0.5 percent to about 50 percent of the total pressure. Preferably, the partial pressure of the tungsten and nitrogen containing reactant gases (i.e., WF$_6$ and at least one of NF$_3$ and N$_2$) is in the range of about 1 percent to about 10 percent of the total pressure.

In the reaction chamber, the deposition pressure is maintained at a lower pressure in the range of about 0.1 torr to about 30 torr. Preferably, the deposition pressure is in the range of about 0.3 torr to about 3 torr. Further, the wafer or substrate temperature is maintained at a lower temperature of about 200° C. to about 500° C. More preferably, the temperature is in the range of about 250° C. to about 400° C., and yet more preferably, the temperature is in the range of about 250° C. to about 350° C. By reducing the temperature and total pressure during the deposition of tungsten nitride on the generally horizontal surfaces, including bottom surface 16, bottom step coverage is improved. For example, a layer of tungsten nitride 24 is formed on bottom surface 16 adjacent the one or more side walls 20.

To further enhance the deposition of tungsten nitride on the bottom surface 16 and other generally horizontal surfaces, e.g., upper surfaces 18, during PECVD, a bias may be applied to the wafer upon which the tungsten nitride is being deposited to make the tungsten nitride deposition more directional. In other words, the bias provides for more uniformity in a vertical direction. For example, a bias may be provided by applying a 0 to 200 volt RF source to the wafer or substrate holder having the wafer positioned thereon.

After formation of tungsten nitride according to the first step during a first time period, the resultant structure is as shown in FIG. 1B. Thereafter, in a second step of the tungsten nitride formation process, tungsten nitride is deposited on the one or more side walls of the opening 14 by PECVD during a second period of time, as illustrated in FIG. 1C. The tungsten nitride deposition during the second time period on the one or more side walls 20 of opening 14 may be performed in the same reaction chamber as the deposition of tungsten nitride on the generally horizontal surfaces or may be performed in a completely different reaction chamber.

In the second step, by introducing helium into the reaction chamber with the other reactant gases and increasing the partial pressure of the tungsten and nitrogen containing reactant gases (i.e., $WF_6$ and at least one of $NF_3$ and $N_2$) relative to the total pressure, conformal coverage of the side walls 20 is improved. Preferably, to provide conformal coverage of the surfaces extending from the bottom surface 16, e.g., side walls 20, $WF_6$, at least one of $NF_3$ and $N_2$, $H_2$, and He are introduced into the reaction chamber, for example, via flow meters. As indicated previously, an inert dilution gas may be introduced to the reaction chamber which will change the total gas flow and partial pressures. In the reaction chamber, the reactant gases are preferably subjected to a glow discharge or plasma created by applying a radio frequency electromagnetic field of 13.56 megahertz at a power density of 0.1 $W/cm^2$ to 2 $W/cm^2$ across the reactant gas mixture.

Preferably, for achieving conformal coverage on the one or more side walls 20 defining opening 14, the partial pressure of the tungsten and nitrogen containing reactant gases (i.e., $WF_6$ and at least one of $NF_3$ and $N_2$) is in the range of about 0.1% to about 20% of the total pressure. Preferably, the partial pressure of the tungsten and nitrogen containing reactant gases (i.e., $WF_6$ and at least one of $NF_3$ and $N_2$) is about 1% to about 10% of the total pressure. Further, the partial pressure of He in the reaction chamber is in the range of about 0.5 percent to about 50 percent. More preferably, the partial pressure of helium in the reaction chamber is in the range of about 5 percent to about 20 percent.

The step of forming tungsten nitride on the one or more side walls 20 is preferably performed in the reaction chamber at a substrate temperature in the range of about 200° C. to about 500° C. More preferably, the temperature is in the range of about 300° C. to about 400° C. Yet further, the deposition pressure in the reaction chamber is in the range of about 0.1 torr to about 30 torr. More preferably, the deposition pressure is in the range of about 0.3 torr to about 3 torr.

When comparing the partial pressures of the tungsten and nitrogen containing reactant gases in the first step to the second step, it is preferred that the partial pressure of the tungsten and nitrogen containing reactant gases (i.e., $WF_6$ and at least one of $NF_3$ and $N_2$) used in depositing the tungsten nitride on the one or more side wall surfaces 20 is in the range of about 1.5 times to about 20 times the partial pressure of the tungsten and nitrogen containing reactant gases (i.e., $WF_6$ and at least one of $NF_3$ and $N_2$) used in depositing the tungsten nitride on the generally horizontal surfaces, e.g., bottom surface 16. Preferably, the partial pressure of the tungsten and nitrogen containing reactant gases (i.e., $WF_6$ and at least one of $NF_3$ and $N_2$) used in depositing tungsten nitride on the one or more side walls 20 is in the range of about 2 times to about 10 times the partial pressure of the tungsten and nitrogen containing reactant gases (i.e., $WF_6$ and at least one of $NF_3$ and $N_2$) used in depositing the tungsten nitride on the bottom surface 16 or generally horizontal surfaces.

One skilled in the art will recognize that alternative plasma enhanced processes may be used for performing the tungsten nitride deposition under similar two step processes and similar parameters as described above with regard to the preferred processes. For example, one plasma enhanced process may use the reactant gases including $WF_6$, $Si_4$, $N_2$, $H_2$ or alternatively, use the reactant gases including $WCl_6$, $Si_4$, $N_2$, $H_2$.

As shown in FIG. 1C, deposition of tungsten nitride during the second step of the formation process used to deposit tungsten nitride on the one or more side walls 20 results in some additional deposition on the generally horizontal surfaces. For example, tungsten nitride regions 30 are formed adjacent the one or more side walls 20, tungsten nitride region 34 is formed over the previously formed tungsten nitride material on the bottom surfaces defining the opening 14, as well as tungsten nitride regions 32 being formed over the tungsten nitride previously deposited over the top surfaces 18. Resulting from the two-step tungsten nitride formation process according to the present invention is the layer 40 as shown in FIG. 1D. The thickness of the tungsten nitride layer is preferably in the range of about 50 Å to about 500 Å. More preferably, the thickness of the tungsten nitride layer 40 is in the range of about 100 Å to about 500 Å. There may be a slight variation in the thickness of the tungsten nitride material deposited on the one or more side walls 20 relative to the bottom surface 16. However, generally, the conformal tungsten nitride layer 40 will have a uniform thickness ±200 Å, preferably ±50 Å.

Two illustrations of using the above described tungsten nitride formation method are described below with reference to FIGS. 2A–2D and FIGS. 3A–3D.

The use of the formation method according to the present invention is described with reference to FIGS. 2A–2D wherein tungsten nitride is used for one or both of the electrodes of a high dielectric capacitor of a storage cell. Further, the tungsten nitride formation method according to the present invention is described with reference to FIGS. 3A–3D wherein a contact liner of tungsten nitride is described. For simplicity purposes, the illustrative descriptions are limited to the use of a tungsten nitride layer described in these two illustrative structures. There are other semiconductor processes and structures for various devices, e.g., CMOS devices, memory devices, etc., that would benefit from the present invention and in no manner is the present invention limited to the illustrative embodiments described herein, e.g., contact liner and electrode structure. The tungsten nitride formation method may be used with any surface area requiring a conforming tungsten nitride layer.

Figure 2A:
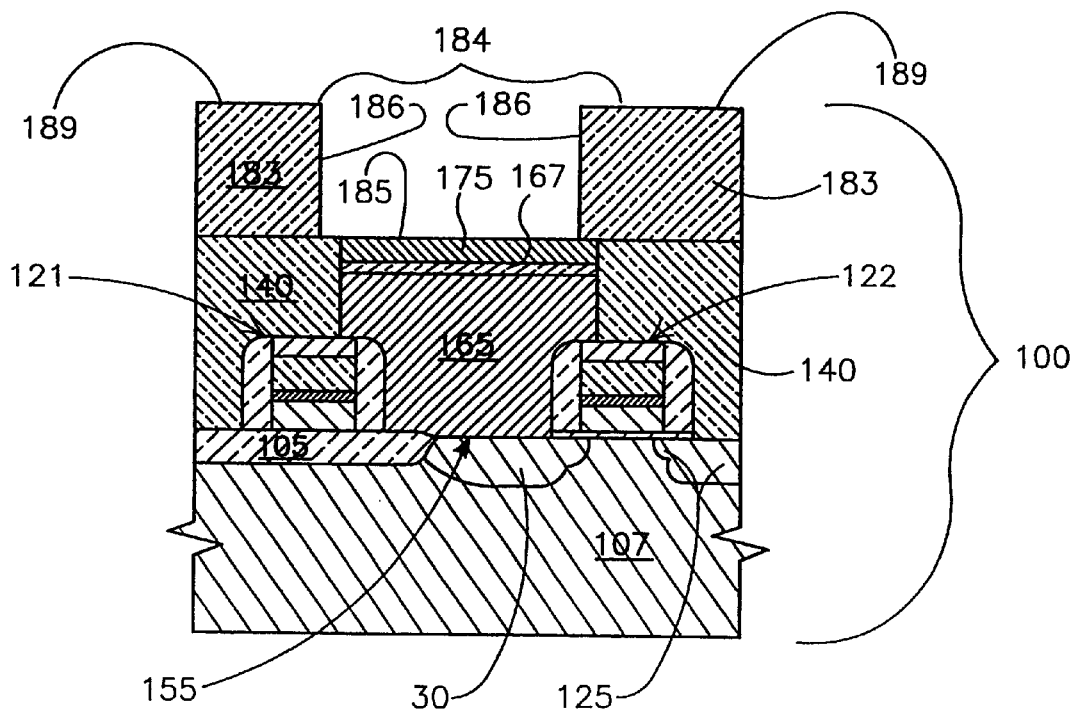
FIGS. 2A–2D illustrate the use of a method according to the present invention in a storage cell capacitor application.

As shown in FIG. 2A, a device structure 100 is fabricated in accordance with conventional processing techniques through the formation of an opening 184. Such processing is performed prior to depositing a bottom electrode structure on the surfaces defining the opening 184 using the tungsten nitride formation method in accordance with the present invention. As such, and as further described in U.S. Pat. No.

5,392,189 to Fazan et al., the device structure 100 includes field oxide regions 105 and active regions, i.e., those regions of the substrate 107 not covered by field oxide. A word line 121 and a field effect transistor (FET) 122 is formed relative to the field oxide region 105 in the active regions. Suitable source/drain regions 125, 130 are created in silicon substrate 107. An insulative conformal layer of oxide material 140 is formed over regions of FET 122 and word line 121. A polysilicon plug 165 is formed to provide electrical communication between the substrate 107 and a storage cell capacitor to be formed thereover. Various barrier layers are formed over the polysilicon plug 165, including layers 167 and 175. For example, such layers may be titanium nitride, tungsten nitride, or any other metal nitride which act as a barrier. For example, such a tungsten nitride layer may be deposited in accordance with the present invention. Thereafter, another insulative layer 183 is formed and an opening 184 is defined therein.

Figure 2B:
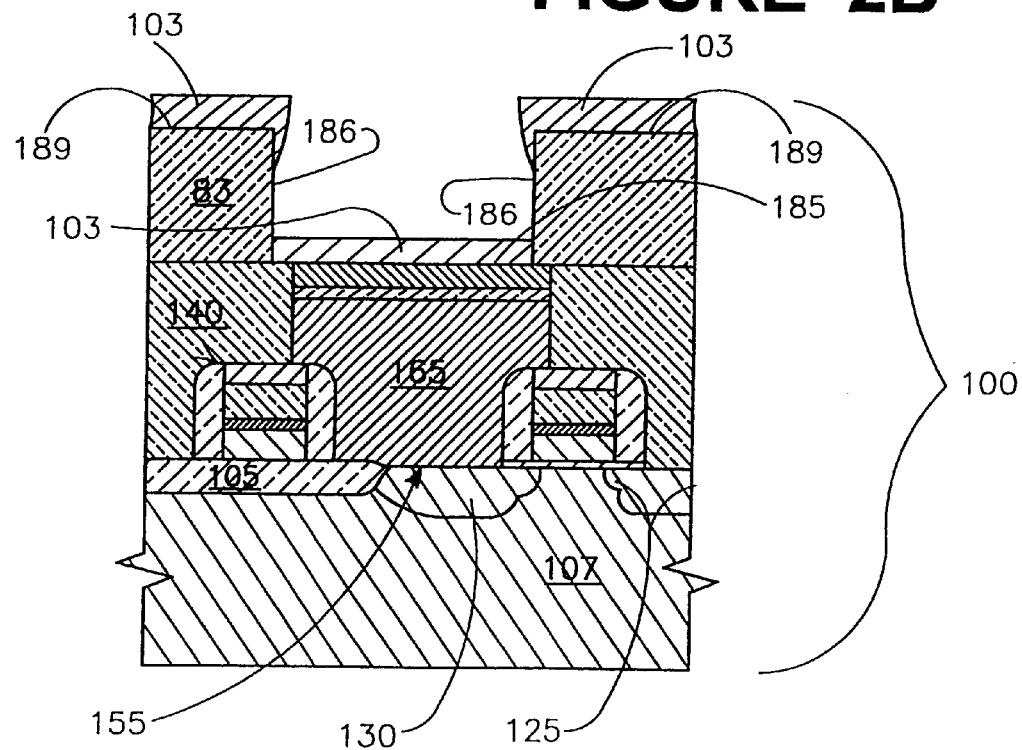
Figure 2C:
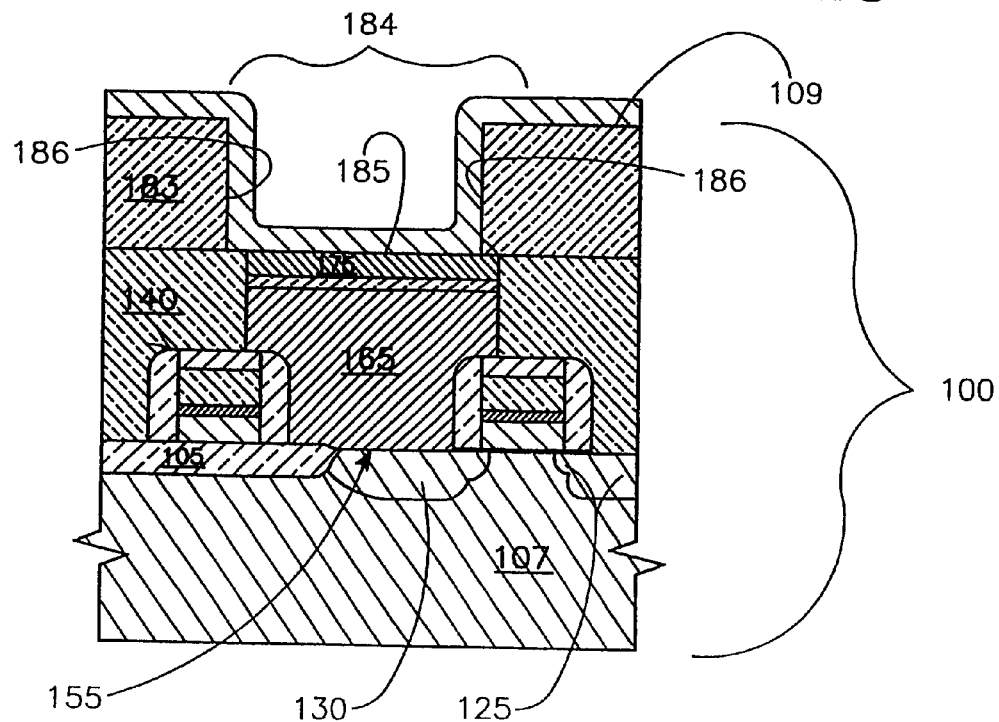
Figure 2D:
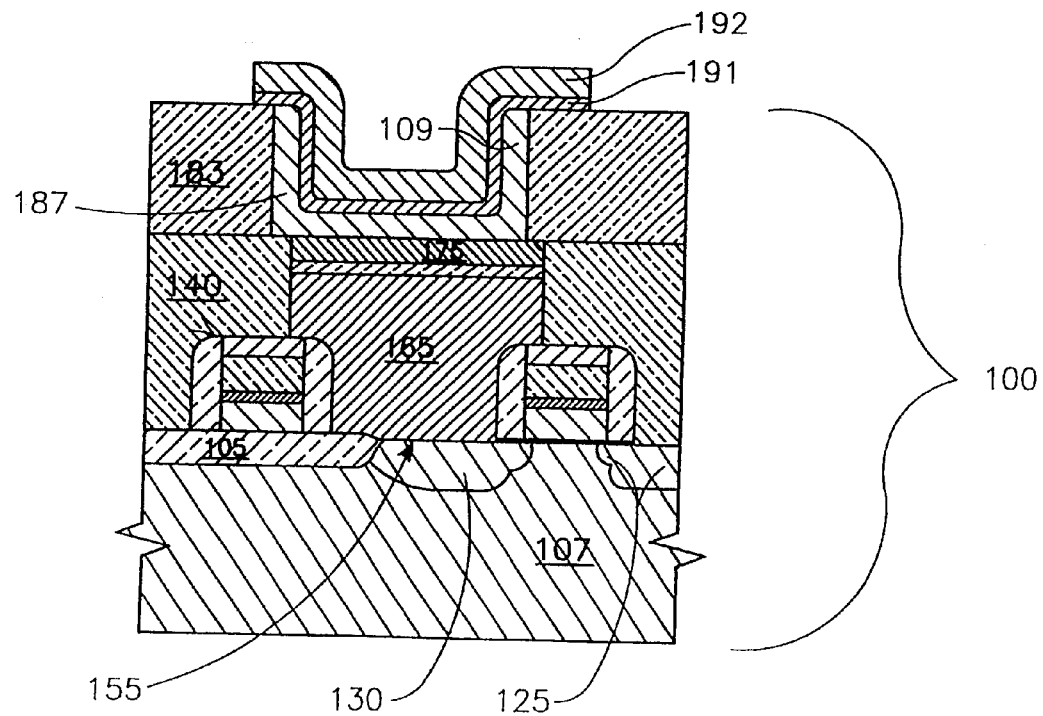

According to one embodiment of the present invention, a tungsten nitride layer 109 is formed on bottom surface 185 and one or more side walls 186 defining opening 184. First, as shown in FIG. 2B, tungsten nitride 103 is formed on the bottom surface 185 and upper surface 189 of the device structure 100. Thereafter, as shown in FIG. 2C, the second step of the tungsten nitride deposition method is used to form tungsten nitride on the one or more side walls 186 defining opening 184. As shown in FIG. 2C, a uniform tungsten nitride layer 109 with conformal coverage is provided. Thereafter, as shown in FIG. 2D, the tungsten nitride layer 109 is formed resulting in tungsten nitride layer 187 lining the opening 184.

A dielectric layer 191 is then formed relative to the tungsten nitride layer 187. For example, the dielectric layer may be any suitable material having a suitable dielectric constant such as $Ba_xSr_{(1-x)}TiO_3$[BST], $BaTiO_3$, $SrTiO_3$, $PbTiO_3$, $Pb(Zr,Ti)O_3$[PZT], $(Pb,La)(Zr,Ti)O_3$[PLZT], $(Pb,La)TiO_3$[PLT], $KNO_3$, and $LiNbO_3$.

Further thereafter, a second electrode 192 is formed relative to the dielectric material 191. In one embodiment of the present invention, the second electrode 192 is also formed of tungsten nitride according to the two step process as described herein and which shall not be described in any further detail.

It will be recognized by one skilled in the art that either one or both of the electrodes of a capacitor may be formed according to the present invention. If one of the electrodes is not formed of tungsten nitride, it may be of any other conductive material generally used for capacitor electrode structures. For example, such an electrode may be of any conductive material such as platinum, titanium nitride, etc. Further, one skilled in the art will recognize that the tungsten nitride layer may be one of several layers forming an electrode stack. With use of the present invention, either one or both electrodes of a capacitor can be formed of tungsten nitride conformally formed of uniform thickness providing desired resistivity and barrier properties.

It will be recognized by one skilled in the art that any capacitor having a surface whereupon tungsten nitride is to be conformally formed thereon will benefit from the present invention. For example, a container capacitor typically includes electrodes formed on surfaces requiring conformal formation. Such a container capacitor storage cell is described in U.S. Pat. No. 5,270,241 to Dennison et al., entitled "Optimized Container Stacked Capacitor DRAM Cell Utilizing Sacrificial Oxide Deposition and Chemical Mechanical Polishing," issued Dec. 14, 1993.

Figure 3A:
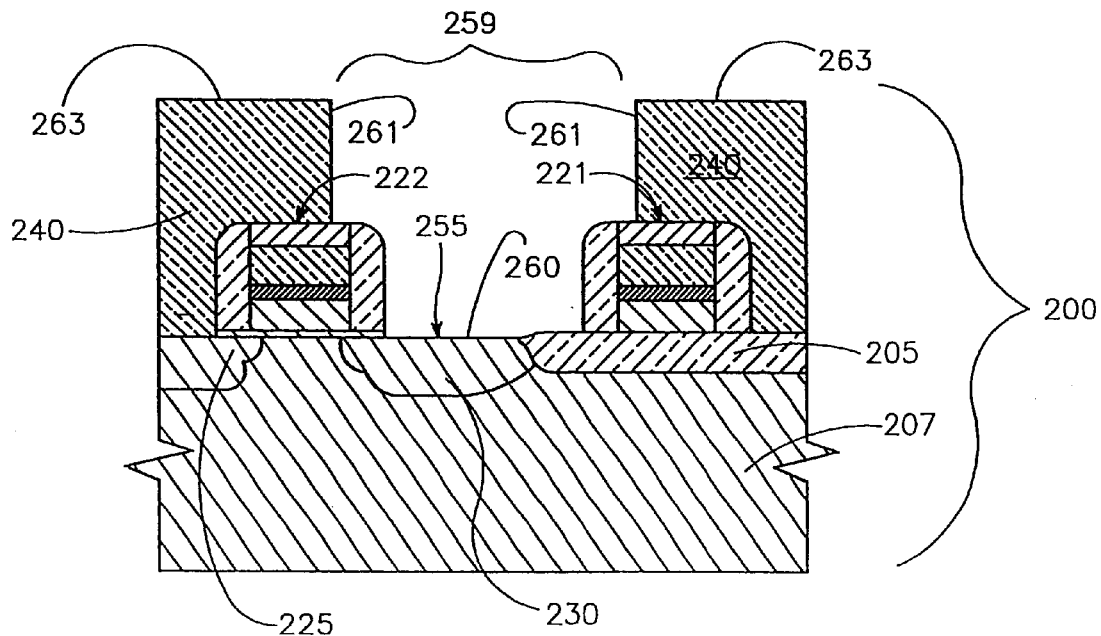
FIGS. 3A–3D show use of a method according to the present invention in a contact application.

As shown in FIG. 3A, device structure 200 is fabricated in accordance with conventional processing techniques through the formation of contact opening 259 prior to metalization of the exposed contact area 255 of substrate 207. As such, prior to metalization, the device structure 200 includes field oxide regions 205 and active areas, i.e., those regions of the substrate 207 not covered by field oxide. Formed relative to the field oxide regions 205 and the active areas are word line 221 and field effect transistor 222. Suitably doped source/drain regions 225 and 230 are formed as known to one skilled in the art. A conformal layer of oxide material 240 is formed thereover and contact opening 259 is defined therein to the exposed contact area 255 in doped region 230 of silicon substrate 207. Thereafter, one or more metalization or conductive layers are formed in the contact opening 259 for providing electrical connection to substrate region 230. For example, various materials may be formed in contact opening 259, such as titanium nitride or other diffusion barrier materials. Preferably, a contact liner 285 is formed of tungsten nitride deposited in accordance with the present invention upon bottom surface 260 and generally horizontal upper surfaces 263 along with the one or more side walls 261 defining the opening 259.

Figure 3B:
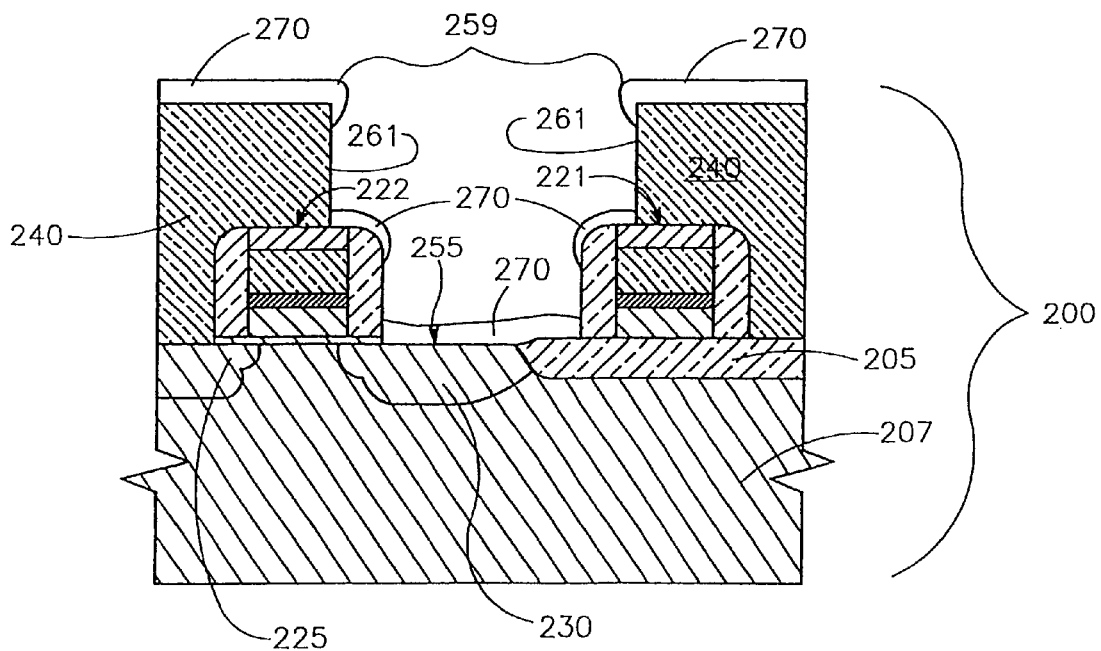
Figure 3C:
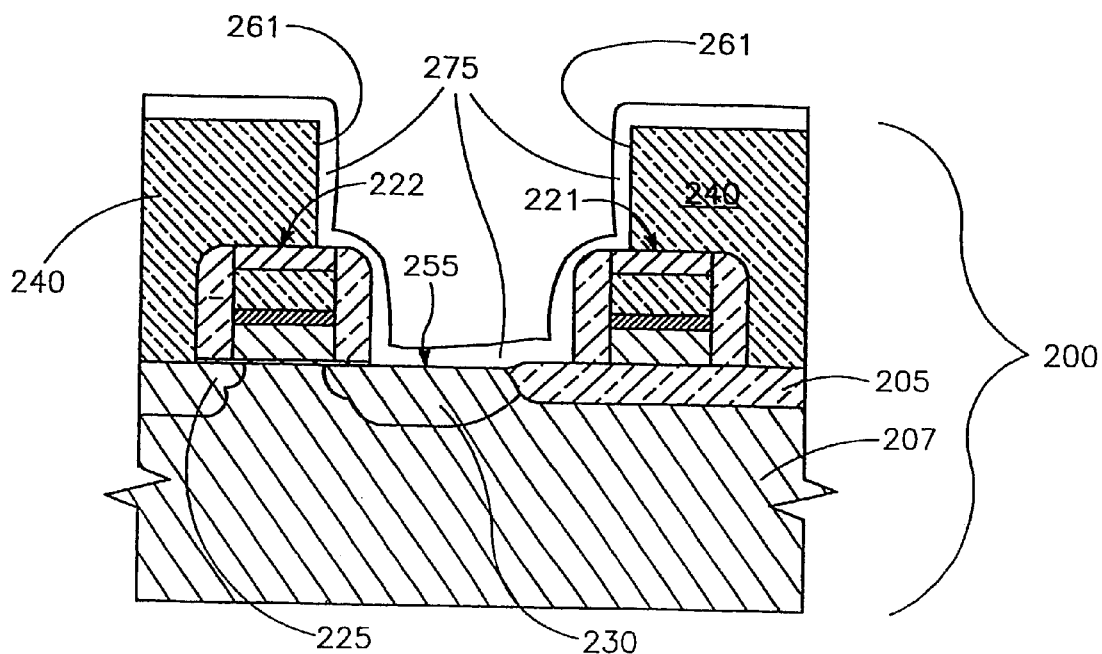
Figure 3D:
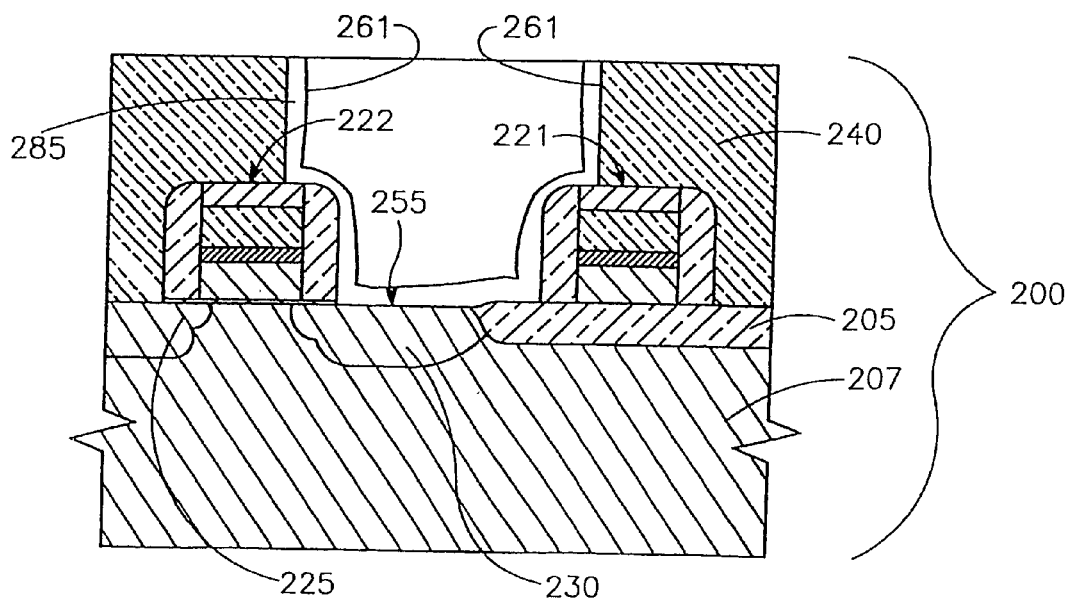

As shown in FIG. 3B, during the first step of the tungsten nitride process, tungsten nitride regions 270 are formed on the generally horizontal surfaces including bottom surface 260, portions of the FET 222 and word line 221 and also upper surfaces 263. Thereafter, a second step of the tungsten nitride deposition process is performed resulting in the uniform tungsten nitride layer 275 over all of the surfaces including side walls 261 as shown in FIG. 3C. Upon removal of portions of the layer, a liner 285 is formed within contact opening 259. Thereafter, a conductive material 276 is formed in the contact opening for providing connection to doped region 230 of substrate 207.

All patents and references cited herein are incorporated in their entirety as if each were incorporated separately. This invention has been described with reference to illustrative embodiments and is not meant to be construed in a limiting sense. As described previously, one skilled in the art will recognize that various other illustrative applications may utilize the formation method as described herein to provide a conformal and uniform layer relative to one or more surfaces. Various modifications of the illustrative embodiments, as well as additional embodiments of the invention, will be apparent to persons skilled in the art upon reference to this description. It is therefore contemplated that the appended claims will cover any such modifications or embodiments that may fall within the scope of the present invention as defined by the accompanying claims.

What is claimed is:

1. A method for use in forming a capacitor, the method comprising:

providing a substrate assembly including an opening defined therein, wherein the opening is defined by a bottom surface of the substrate assembly and at least one side wall extending therefrom; and forming an electrode including a tungsten nitride layer on the bottom surface and the at least one side wall, wherein the layer is of a thickness in the range of about 50 Å to about 500 Å, wherein the forming of the tungsten nitride layer comprises:

forming tungsten nitride on at least the bottom surface during a first time period, and depositing tungsten nitride on at least the side wall by plasma enhanced chemical vapor deposition during a second time period.

2. The method of claim 1, wherein forming tungsten nitride on at least the bottom surface during the first time period includes depositing the tungsten nitride by plasma enhanced chemical vapor deposition using a first gas mixture including $WF_6$, at least one of $NF_3$ and $N_2$, and $H_2$, and further wherein depositing tungsten nitride on at least the side wall by plasma enhanced chemical vapor deposition during a second time period includes using a second reactant gas mixture including $WF_6$, at least one of $NF_3$ and $N_2$, $H_2$, and He.

3. The method of claim 2, wherein the partial pressure of $WF_6$ and the at least one $NF_3$ and $N_2$ is in a range of about 0.1 percent to about 20 percent of the total pressure when depositing tungsten nitride on the at least one side wall.

4. The method of claim 3, wherein the partial pressure of He is in a range of about 0.5 percent to about 50 percent of the total pressure when depositing tungsten nitride on the at least one side wall.

5. The method of claim 2, wherein depositing tungsten nitride on the bottom surface includes depositing the tungsten nitride at a temperature in a range of about 200° C. to about 500° C. and a deposition pressure in a range of about 0.1 torr to about 30 torr.

6. The method of claim 1, wherein the electrode is a top electrode of the capacitor.

7. The method of claim 1, wherein the electrode is a bottom electrode of the capacitor.

8. A method for use in forming an interconnect, the method comprising:

providing a substrate assembly having an opening defined therein, the opening defined by a bottom conductive surface and at least one side wall extending therefrom; and forming an interconnect structure on the bottom surface and the at least one side wall, wherein forming the interconnect structure includes:

depositing tungsten nitride on at least the bottom surface by plasma enhanced chemical vapor deposition using a first gas mixture including $WF_6$, at least one of $NF_3$ and $N_2$, and $H_2$, and depositing tungsten nitride on at least the side wall by plasma enhanced chemical vapor deposition using a second reactant gas mixture including $WF_6$, at least one of $NF_3$ and $N_2$, $H_2$, and He; and forming one or more additional conductive materials relative to the tungsten nitride.

9. The method of claim 8, wherein depositing tungsten nitride on the bottom surface includes depositing the tungsten nitride at a temperature in a range of about 200° C. to about 500° C. and a deposition pressure in a range of about 0.1 torr to about 30 torr.

10. The method of claim 8, wherein the partial pressure of $WF_6$ and the at least one $NF_3$ and $N_2$ is in a range of about 0.1 percent to about 20 percent of the total pressure when depositing tungsten nitride on the at least one side wall.

11. The method of claim 10, wherein the partial pressure of He is in a range of about 0.5 percent to about 50 percent of the total pressure when depositing tungsten nitride on the at least one side wall.

12. The method of claim 11, wherein depositing tungsten nitride on the at least one side wall includes depositing the tungsten nitride at a temperature in a range of about 200° C. to about 500° C.

13. The method of claim 8, Wherein the opening is one of a contact opening and a via, the one of the contact opening and via having an aspect ratio greater than 1 micron and a critical dimension of less than 1 micron, and further wherein the tungsten nitride is formed of a thickness in a range of about 50 Å to about 500 Å.

* * * * *